US012663451B2

(12) United States Patent (10) Patent No.: US 12,663,451 B2
Park et al. (45) Date of Patent: Jun. 23, 2026

(54) APPARATUS AND METHOD FOR MEASURING PHYSICAL PROPERTIES OF HAIRPIN COILS, AND METHOD OF FORMING HAIRPIN COILS BASED ON THE SAME

(71) Applicants: HYUNDAI MOBIS CO., LTD., Seoul (KR); RESEARCH & BUSINESS FOUNDATION SUNGKYUNKWAN UNIVERSITY, Suwon-si (KR)

(72) Inventors: Ji Hyun Park, Yongin-si (KR); Dong Wook Yang, Yongin-si (KR); Eun Ho Lee, Suwon-si (KR); Young Dae Shim, Suwon-si (KR)

(73) Assignees: Hyundai Mobis Co., Ltd., Seoul (KR); Research & Business Foundation Sungkyunkwan University, Suwon-si (KR)

( * ) Notice: Subject to any disclaimer, the term of this patent is extended or adjusted under 35 U.S.C. 154(b) by 290 days.

(21) Appl. No.: 18/214,098

(22) Filed: Jun. 26, 2023

(65) Prior Publication Data

US 2024/0151758 A1 May 9, 2024

(30) Foreign Application Priority Data

Nov. 4, 2022 (KR) ........................ 10-2022-0146149

(51) Int. Cl.
*G01R 27/16* (2006.01)
(52) U.S. Cl.
CPC .................................... *G01R 27/16* (2013.01)

(58) Field of Classification Search
CPC .. G01R 27/16; G01N 27/025; G01B 11/2518; H02K 15/0421; H02K 15/20
USPC ......................................................... 324/650
See application file for complete search history.

(56) References Cited

U.S. PATENT DOCUMENTS

| | | | | |
|---|---|---|---|---|
| 4,289,946 A | * | 9/1981 | Yarwood ................ | H05B 6/067 |
| | | | | 219/602 |
| 2016/0274060 A1 | * | 9/2016 | Denenberg ............. | G01R 27/02 |
| 2017/0030848 A1 | * | 2/2017 | Borigo ................... | B64D 15/20 |

FOREIGN PATENT DOCUMENTS

| | | | | | |
|---|---|---|---|---|---|
| CN | 113156349 A | * | 7/2021 | ............. | G01R 33/12 |
| DE | 69635353 T2 | * | 7/2006 | ............. | G01B 7/023 |
| KR | 10-2017-0066859 A | | 6/2017 | | |

* cited by examiner

*Primary Examiner* — Arleen M Vazquez
*Assistant Examiner* — Robert P Alejnikov, Jr.
(74) *Attorney, Agent, or Firm* — Morgan, Lewis & Bockius LLP

(57) ABSTRACT

Disclosed herein is an apparatus for measuring physical properties of hairpin coils, which includes a current sensor configured to apply a current for each frequency to a material of a hairpin coil to measure an induced current applied to the material, and a measurement processor configured to measure physical properties of the material by measuring an impedance of the material with the induced current measured by the current sensor and applying the impedance to a model established in the material.

5 Claims, 14 Drawing Sheets

100

APPARATUS AND METHOD FOR MEASURING PHYSICAL PROPERTIES OF HAIRPIN COILS, AND METHOD OF FORMING HAIRPIN COILS BASED ON THE SAME

CROSS-REFERENCE TO RELATED APPLICATION

This application claims priority from and the benefit of Korean Patent Application No. 10-2022-0146149, filed on Nov. 4, 2022, which is hereby incorporated by reference for all purposes as if set forth herein.

BACKGROUND

Field

Exemplary embodiments of the present disclosure relate to an apparatus and method for measuring physical properties of hairpin coils, and a method of forming hairpin coils based on the same.

Discussion of the Background

In recent years, a method of winding flat coils, each having a substantially square cross-section, has been studied, instead of the method of winding annular coils, each having a circular cross-section in order to enhance the power of a motor without increasing the size of the motor.

However, it is relatively difficult to wind the flat coils, compared to winding the annular coils. Accordingly, in order to easily wind the flat coils, a motor has been proposed in which a hairpin coil is inserted into a stator coil and then welded to form a coil winding part.

The hairpin coil is used to produce a finished hairpin coil product. To this end, the hairpin coil is coated with enamel, cut, and shaped (e.g., bent or formed), and a portion of the enamel coated on the hairpin coil is peeled off to provide a welded part, and then chamfered.

A conventional method of manufacturing a hairpin coil may lead to a poor hairpin coil due to the inconsistent quality of the material thereof.

In addition, a conventional tensile test method, which measures physical properties of a hairpin coil by breaking the material thereof, may be difficult to check the physical properties in real time, may take a long time in advance preparation for the test, and may cause an error depending on the precision of a device and the skill of an operator.

The related art of the present disclosure is disclosed in Korean Patent Application Publication No. 10-2017-0066859 (Jun. 15, 2017), entitled "METHOD OF MANUFACTURING HAIRPIN COIL".

SUMMARY

Various embodiments are directed to an apparatus and method for measuring physical properties of hairpin coils, and a method of forming hairpin coils based on the same, which are capable of forming a hairpin coil by measuring physical properties of a material in a non-destructive manner in real time and deriving a process condition based on the measured physical properties of the material.

In an embodiment, there is provided an apparatus for measuring physical properties of hairpin coils, which includes a current sensor configured to apply a current for each frequency to a material of a hairpin coil to measure an induced current applied to the material, and a measurement processor configured to measure physical properties of the material by measuring an impedance of the material with the induced current measured by the current sensor and applying the impedance to a model established in the material.

The current sensor may come into contact with the material to measure the induced current generated in the material in a non-destructive manner.

In another embodiment, there is provided a method for measuring physical properties of hairpin coils, which includes applying, by a current sensor, a current for each frequency to a material of a hairpin coil to measure an induced current applied to the material, and measuring, by a measurement processor, physical properties of the material by measuring an impedance of the material with the induced current measured by the current sensor and applying the impedance to a model established in the material.

The applying, by a current sensor, a current may include measuring, by a first current sensor, an induced current by applying a current to the material before a flattening process of flattening the material, and measuring, by a second current sensor, an induced current by applying a current to the material after the flattening process of flattening the material.

In the measuring, by a measurement processor, physical properties of the material, the measurement processor may use both the induced current measured by the first current sensor and the induced current measured by the second current sensor to extract a change in physical properties due to plastic deformation of the material before and after the flattening process.

In the measuring, by a measurement processor, physical properties of the material, the measurement processor may extract an induced current parameter by applying the impedance to the model established in the material, and analyze the induced current parameter to measure the physical properties of the material.

The induced current parameter may include at least one of an amplitude, a phase, a real component, and an imaginary component of the induced current.

The physical properties of the material may include at least one of yield strength, tensile strength, and elongation of the material.

In a further embodiment, there is provided a method of forming hairpin coils, which includes measuring a shape of a hairpin coil by a shape measurement unit, and comparing, by process processor, the shape of the hairpin coil measured by the shape measurement unit with a reference shape to derive a process condition of the hairpin coil based on process data and physical properties of a material of the hairpin coil according to a result of the comparison.

The method of forming hairpin coils may further include controlling, by a process controller, a forming process of the hairpin coil based on the process condition.

In the measuring a shape of a hairpin coil, the shape measurement unit may measure a length and an angle of a body and a length and an angle of a head of the hairpin coil.

The process data may include process data between a flattening process and a feeding process of the material and between a nozzle process and a bending process of the material.

The process condition may include at least one of a feeding length, a bending angle, and a bending speed of the material.

The physical properties of the material may be measured by applying an alternating current for each frequency to the material to measure an induced current applied to the material and applying an impedance of the material measured with the induced current to a model established in the material.

In the comparing, by process processor, the shape of the hairpin coil, the process processor may derive the process condition based on a change in physical properties due to plastic deformation before and after a flattening process of the material.

As apparent from the above description, in the apparatus and method for measuring physical properties of hairpin coils, and the method of forming hairpin coils based on the same according to the present disclosure, it is possible to form the hairpin coil by measuring the physical properties of the material in a non-destructive manner in real time and deriving the process condition based on the measured physical properties of the material.

In addition, in the apparatus and method for measuring physical properties of hairpin coils, and the method of forming hairpin coils based on the same according to the present disclosure, it is possible to acquire and store the highly reliable physical properties of the material and optimize the forming process of the hairpin coil based on the measured physical properties of the material.

DETAILED DESCRIPTION OF THE ILLUSTRATED EMBODIMENTS

Figure 1:
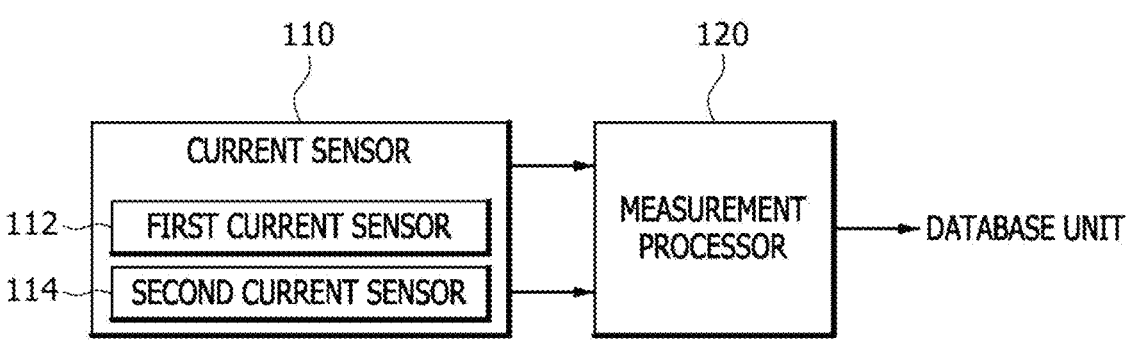
FIG. 1 is a block diagram illustrating an apparatus for measuring physical properties of hairpin coils according to an embodiment of the present disclosure.

The components described in the example embodiments may be implemented by hardware components including, for example, at least one digital signal processor (DSP), a processor, a controller, an application-specific integrated circuit (ASIC), a programmable logic element, such as an FPGA, other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be embodied as a program that is executable by a computer, and may be implemented as various recording media such as a magnetic storage medium, an optical reading medium, and a digital storage medium.

Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing by, or to control an operation of a data processing apparatus, e.g., a programmable processor, a computer, or multiple computers. A computer program(s) may be written in any form of a programming language, including compiled or interpreted languages and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network.

Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic, magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc. and magneto-optical media such as a floptical disk, and a read only memory (ROM), a random access memory (RAM), a flash memory, an erasable programmable ROM (EPROM), and an electrically erasable programmable ROM (EEPROM) and any other known computer readable medium. A processor and a memory may be supplemented by, or integrated into, a special purpose logic circuit.

The processor may run an operating system (OS) and one or more software applications that run on the OS. The processor device also may access, store, manipulate, process, and create data in response to execution of the software. For purpose of simplicity, the description of a processor device is used as singular; however, one skilled in the art will be appreciated that a processor device may include multiple processing elements and/or multiple types of processing elements. For example, a processor device may include multiple processors or a processor and a controller. In addition, different processing configurations are possible, such as parallel processors.

Also, non-transitory computer-readable media may be any available media that may be accessed by a computer, and may include both computer storage media and transmission media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

Hereinafter, with reference to the accompanying drawings, embodiments of the present disclosure will be described in detail so that a person skilled in the art can readily carry out the present disclosure. However, the present disclosure may be embodied in many different forms and is not limited to the embodiments described herein.

In the following description of the embodiments of the present disclosure, a detailed description of known functions and configurations incorporated herein will be omitted when it may make the subject matter of the present disclosure rather unclear. Parts not related to the description of the present disclosure in the drawings are omitted, and like parts are denoted by similar reference numerals.

In the present disclosure, components that are distinguished from each other are intended to clearly illustrate each feature. However, it does not necessarily mean that the components are separate. That is, a plurality of components may be integrated into one hardware or software unit, or a single component may be distributed into a plurality of hardware or software units. Thus, unless otherwise noted, such integrated or distributed embodiments are also included within the scope of the present disclosure.

In the present disclosure, components described in the various embodiments are not necessarily essential components, and some may be optional components. Accordingly, embodiments consisting of a subset of the components described in one embodiment are also included within the scope of the present disclosure. In addition, embodiments that include other components in addition to the components described in the various embodiments are also included in the scope of the present disclosure.

Hereinafter, with reference to the accompanying drawings, embodiments of the present disclosure will be described in detail so that a person skilled in the art can readily carry out the present disclosure. However, the present disclosure may be embodied in many different forms and is not limited to the embodiments described herein.

In the following description of the embodiments of the present disclosure, a detailed description of known functions and configurations incorporated herein will be omitted when it may make the subject matter of the present disclosure rather unclear. Parts not related to the description of the present disclosure in the drawings are omitted, and like parts are denoted by similar reference numerals.

In the present disclosure, when a component is referred to as being "linked," "coupled," or "connected" to another component, it is understood that not only a direct connection relationship but also an indirect connection relationship through an intermediate component may also be included. In addition, when a component is referred to as "comprising" or "having" another component, it may mean further inclusion of another component not the exclusion thereof, unless explicitly described to the contrary.

In the present disclosure, the terms first, second, etc. are used only for the purpose of distinguishing one component from another, and do not limit the order or importance of components, etc., unless specifically stated otherwise. Thus, within the scope of this disclosure, a first component in one exemplary embodiment may be referred to as a second component in another embodiment, and similarly a second component in one exemplary embodiment may be referred to as a first component.

In the present disclosure, components that are distinguished from each other are intended to clearly illustrate each feature. However, it does not necessarily mean that the components are separate. That is, a plurality of components may be integrated into one hardware or software unit, or a single component may be distributed into a plurality of hardware or software units. Thus, unless otherwise noted, such integrated or distributed embodiments are also included within the scope of the present disclosure.

In the present disclosure, components described in the various embodiments are not necessarily essential components, and some may be optional components. Accordingly, embodiments consisting of a subset of the components described in one embodiment are also included within the scope of the present disclosure. In addition, exemplary embodiments that include other components in addition to the components described in the various embodiments are also included in the scope of the present disclosure.

Hereinafter, an apparatus and method for measuring physical properties of hairpin coils, and a method of forming hairpin coils based on the same according to exemplary embodiments of the present disclosure will be described in detail with reference to the accompanying drawings. It should be considered that the thickness of each line or the size of each component in the drawings may be exaggeratedly illustrated for clarity and convenience of description. In addition, the terms as used herein are defined in consideration of functions of the present disclosure, and these terms may change depending on the intention or practice of a user or an operator. Therefore, these terms should be defined based on the entirety of the disclosure set forth herein.

Figure 2:
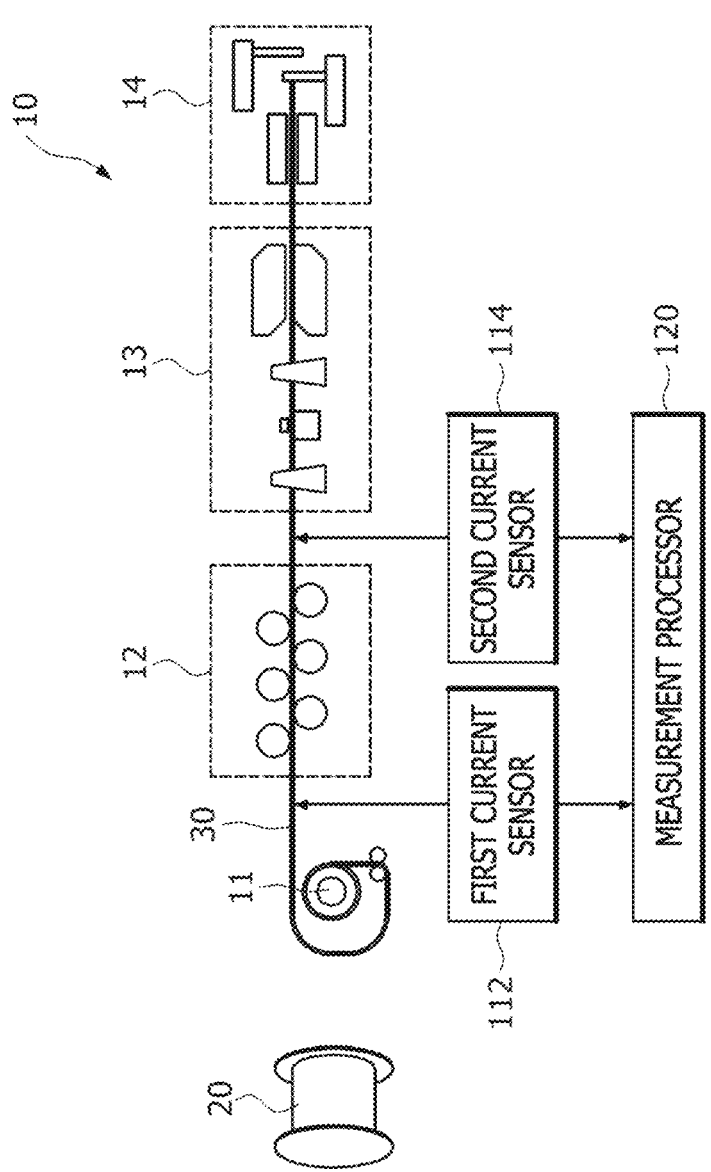
FIG. 2 is a conceptual diagram illustrating a physical property measurement step in a hairpin coil forming process of the apparatus for measuring physical properties of hairpin coils according to the embodiment of the present disclosure.

FIG. 1 is a block diagram illustrating an apparatus for measuring physical properties of hairpin coils according to an embodiment of the present disclosure. FIG. 2 is a conceptual diagram illustrating a physical property measurement step in a hairpin coil forming process of the apparatus for measuring physical properties of hairpin coils according to the embodiment of the present disclosure.

Referring to FIG. 1, the apparatus for measuring physical properties of hairpin coils, which is designated by reference numeral 100, according to the embodiment of the present disclosure includes a current sensor 110 and a measurement processor 120.

The current sensor 110 is installed in a forming process line 10 for forming a hairpin coil 30.

The current sensor 110 applies an alternating current for each frequency to the material of the hairpin coil 30 to measure an eddy current, namely, an induced current that flows through the material before and after a flattening process.

The current sensor 110 includes a first current sensor 112 and a second current sensor 114.

The first current sensor 112 is installed before the flattening process in the forming process line 10 for the material of the hairpin coil.

The first current sensor 112 applies an alternating current for each frequency to the material before the flattening process, and measures an induced current applied to the material by the alternating current for each frequency.

The second current sensor 114 is installed after the flattening process in the forming process line 10 for the material of the hairpin coil 30.

The second current sensor 114 applies an alternating current for each frequency to the material after the flattening process, and measures an induced current applied to the material by the alternating current for each frequency.

Referring to FIG. 2, the forming process line 10 allows the material to be formed into the hairpin coil 30.

The forming process line 10 includes a flattening process module 12, a feeding and nozzle process module 13, and a bending process module 14.

First, a bobbin 20 around which the material is wound is inserted into a main roller 11 of the forming process line 10.

The flattening process module 12 serves to flatten the material wound around the bobbin 20 by pressing the same with a plurality of rollers. In this case, the material may be plastically deformed through the flattening process.

The feeding and nozzle process module 13 serves to pull the material flattened by the flattening process module 12, to insert the same into a nozzle, and to peel off the film on the end of the hairpin coil 30, thereby allowing a current to flow through the hairpin coil 30.

The bending process module 14 serves to cut and bend the material with the film peeled off so as to form the hairpin coil 30.

For reference, although the forming process has been exemplarily described in this embodiment, including the bobbin insertion process, the flattening process, the feeding and nozzle process, and the bending process, various processes may be added and modified other than the above processes.

Each of the first and second current sensors 112 and 114 may adopt an encircling-type induced current probe.

Figure 3:
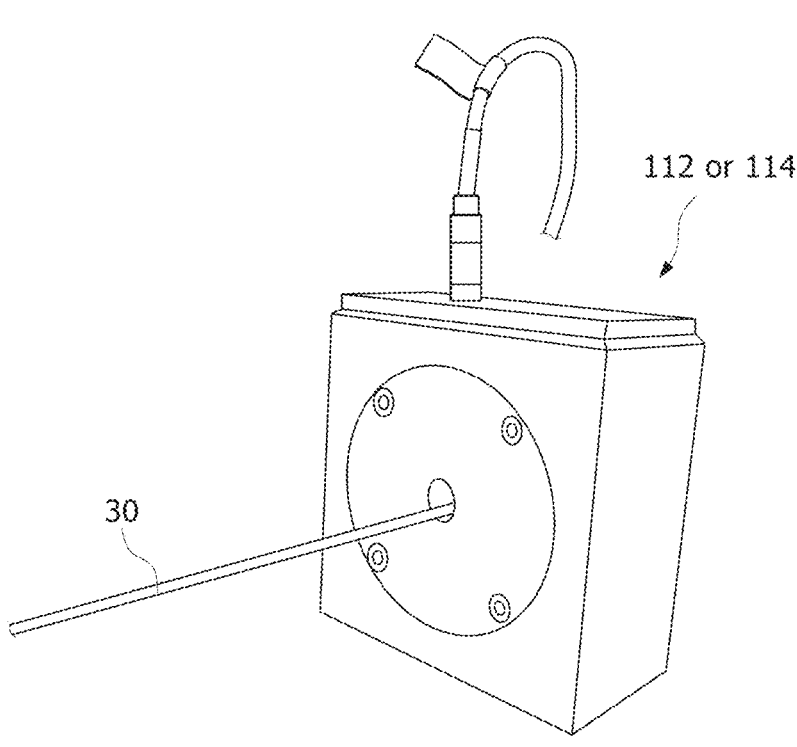
FIG. 3 is a view illustrating a configuration of a first or second current sensor of the apparatus for measuring physical properties of hairpin coils according to the embodiment of the present disclosure.

FIG. 3 is a view illustrating a configuration of the first current sensor 112 or the second current sensor 114 of the apparatus for measuring physical properties of hairpin coils according to the embodiment of the present disclosure.

Referring to FIG. 3, the encircling-type induced current probe has a center formed therethrough such that the material is inserted through the center. The probe may serve to apply an alternating current for each frequency to the material and to measure an induced current applied to the material by coming into contact with the material in a non-destructive manner.

The encircling-type induced current probe can be designed in various shapes to suit the user's convenience. The probe may, however, be advantageous to be an encircling-type probe that is highly usable in the production process when the hairpin coil 30 is formed from, for example, a wire material.

For reference, although the first current sensor 112 and the second current sensor 114 have been exemplarily described in this embodiment as each being an encircling-type induced current probe, they are not particularly limited as long as the physical properties of the material can be measured in a non-destructive manner.

Examples of the physical properties of the material may include yield strength, tensile strength, and elongation.

The measurement processor 120 serves to measure an impedance of the material with the induced current measured by the current sensor 110 and to measure physical properties of the material by applying the impedance to a model established in the material.

More specifically, the measurement processor 120 first measures the impedance of the material before it is put into the flattening process by means of the induced current measured by the first current sensor 112.

The measurement processor 120 reflects the impedance to an induced current-mechanical property model established for the material to extract an induced current parameter that reflects the physical properties of the material.

Examples of the induced current parameter may include an amplitude, a phase, a real component, and an imaginary component of the induced current.

The measurement processor 120 measures the physical properties of the material by analyzing the induced current parameter. To this end, the measurement processor 120 may utilize a machine learning technique based on multiple regression analysis for the above induced current parameter, for example, for each of the amplitude, the phase, the real component, and the imaginary component.

Figure 4:
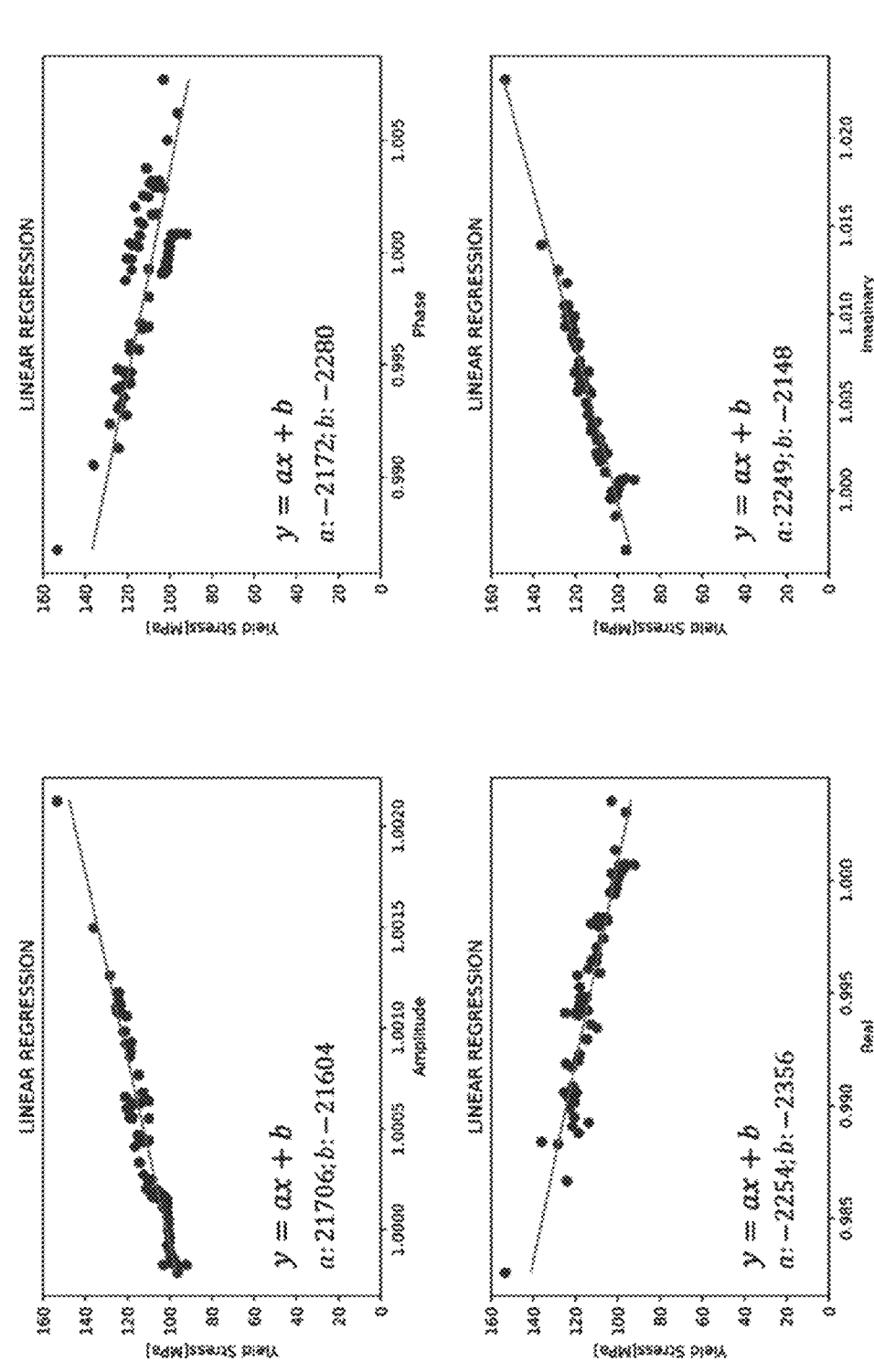
FIG. 4 is a graph illustrating an example in which yield strength is measured through a machine learning technique based on multiple regression analysis according to the embodiment of the present disclosure.
Figure 5:
FIG. 5 is a graph illustrating an example in which tensile strength is measured through the machine learning technique based on multiple regression analysis according to the embodiment of the present disclosure.
Figure 6:
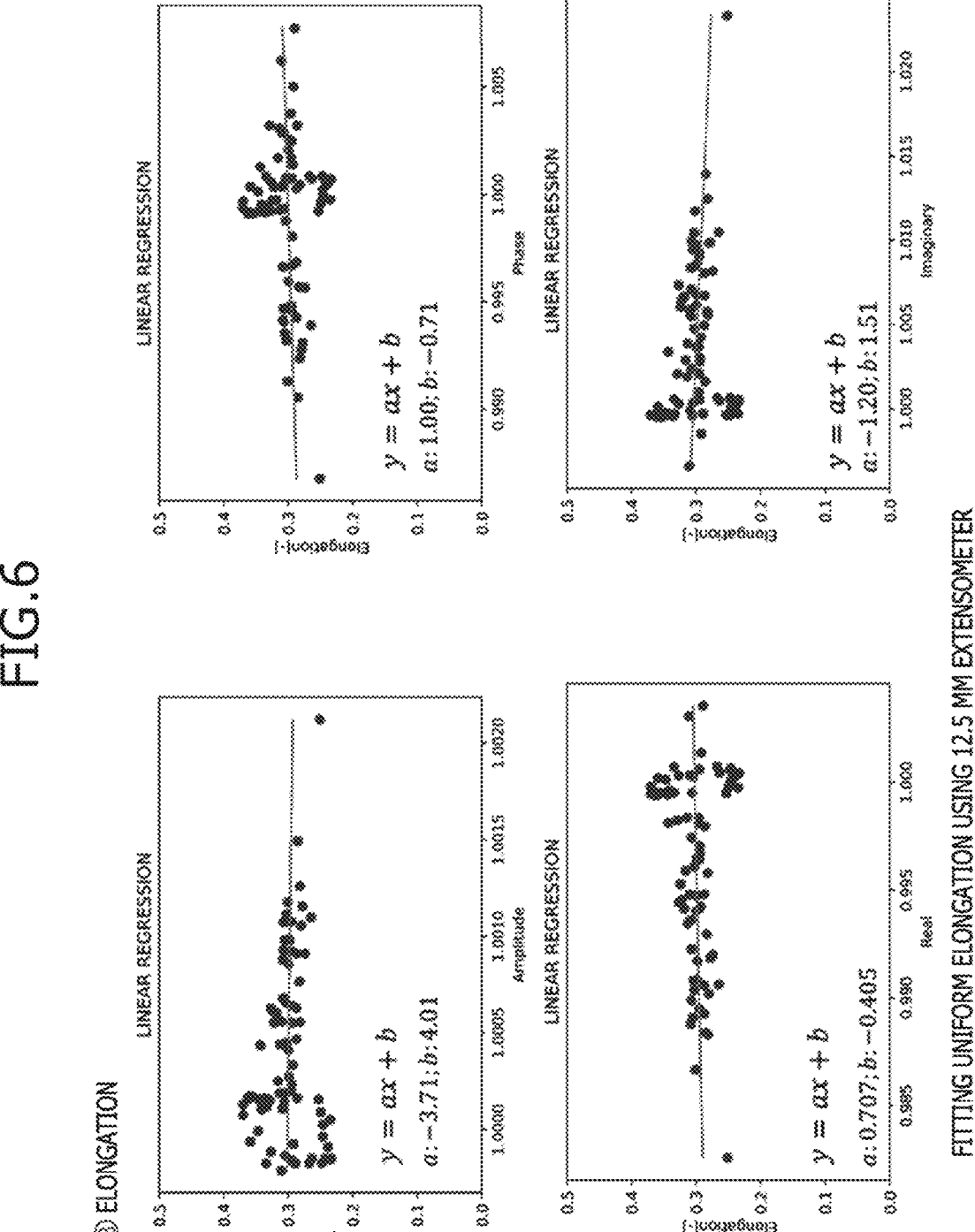
FIG. 6 is a diagram illustrating an example in which elongation is measured through the machine learning technique based on multiple regression analysis according to the embodiment of the present disclosure.

FIG. 4 is a graph illustrating an example in which yield strength is measured through the machine learning technique based on multiple regression analysis according to the embodiment of the present disclosure. FIG. 5 is a graph illustrating an example in which tensile strength is measured through the machine learning technique based on multiple regression analysis according to the embodiment of the present disclosure. FIG. 6 is a diagram illustrating an example in which elongation is measured through the machine learning technique based on multiple regression analysis according to the embodiment of the present disclosure.

FIG. 4 illustrates the distribution and trend line of the yield strength for each amplitude, phase, real component, and imaginary component. FIG. 5 illustrates the distribution and trend line of the tensile strength for each amplitude, phase, real component, and imaginary component. FIG. 6 illustrates the distribution and trend line of the elongation for each amplitude, phase, real component, and imaginary component.

Accordingly, the measurement processor 120 predicts the physical properties of the material before the flattening process based on the above trend lines.

The measurement processor 120 then measures the impedance of the material after the flattening process by means of the induced current measured by the second current sensor 114.

The measurement processor 120 reflects the impedance to the induced current-mechanical property model established for the material to extract the induced current parameter that reflects the physical properties of the material, and predicts the physical properties by obtaining the trend lines from the extracted induced current parameter through the machine learning technique based on multiple regression analysis. The method of measuring the physical properties of the material based on the impedance of the material before the flattening process measured by means of the induced current measured by the first current sensor 112 is the same as the method of measuring the physical properties of the material based on the impedance of the material after the flattening process measured by means of the induced current measured by the second current sensor 114.

As described above, when the physical properties of the material before and after the flattening process are measured, the measurement processor 120 extracts a change in physical properties before and after the flattening process. That is, the material may be plastically deformed during the flattening process. Accordingly, the measurement processor 120 may predict physical properties of each material based on the induced currents measured by the first and second current sensors 112 and 114, and thus extract a change in physical properties due to the plastic deformation before and after the flattening process for each physical property.

The measurement processor 120 delivers, to an apparatus for forming hairpin coils 200, which will be described later, the change in physical properties due to the plastic deformation before and after the flattening process.

Figure 7:
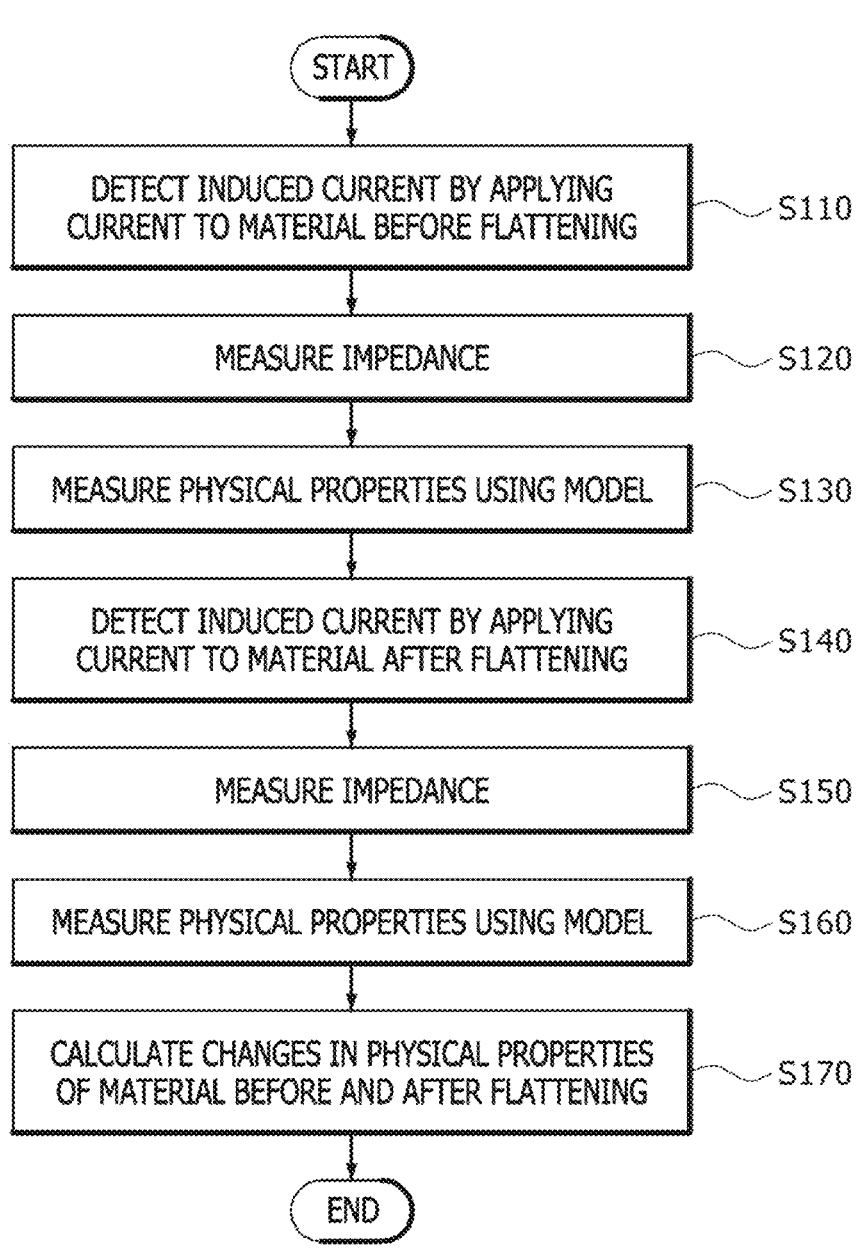
FIG. 7 is a flowchart illustrating a method for measuring physical properties of hairpin coils according to another embodiment of the present disclosure.

FIG. 7 is a flowchart illustrating a method for measuring physical properties of hairpin coils according to another embodiment of the present disclosure.

Referring to FIG. 7, in a process of forming a material into a hairpin coil 30, a first current sensor 112 applies an alternating current for each frequency to a material before a flattening process, and detects an induced current applied to the material by the alternating current for each frequency (S110).

A measurement processor 120 measures an impedance of the material before it is put into the flattening process by means of the induced current measured by the first current sensor 112 (S120).

The measurement processor 120 reflects the impedance to an induced current-mechanical property model established for the material to extract an induced current parameter that reflects the physical properties of the material, and measures the physical properties of the material before the flattening process by obtaining trend lines from the extracted induced current parameter through a machine learning technique based on multiple regression analysis (S130).

Then, when the flattening process is performed on the material, a second current sensor 114 applies an alternating current for each frequency to the material after the flattening process, and detects an induced current applied to the material by the alternating current for each frequency (S140).

The measurement processor 120 measures an impedance of the material after the flattening process by means of the induced current measured by the second current sensor 114 (S150).

The measurement processor 120 reflects the impedance to the induced current-mechanical property model established for the material to extract the induced current parameter that reflects the physical properties of the material, and measures the physical properties of the material after the flattening process by obtaining trend lines from the extracted induced current parameter through the machine learning technique based on multiple regression analysis (S160).

As described above, when the physical properties of the material before and after the flattening process are measured, the measurement processor 120 compares the physical properties before and after the flattening process to calculate a change in physical properties due to the plastic deformation before and after the flattening process for each physical property (S170).

In this embodiment, the apparatus for forming hairpin coils 200 derives a process condition for forming the hairpin coil based on the change in physical properties due to the plastic deformation before and after the flattening process extracted by the apparatus for measuring physical properties of hairpin coils 100, and reflects the derived process condition in the hairpin coil forming process.

Hereinafter, an apparatus and method for forming hairpin coils according to exemplary embodiments of the present disclosure will be described with reference to FIGS. 8 to 15.

Figure 8:
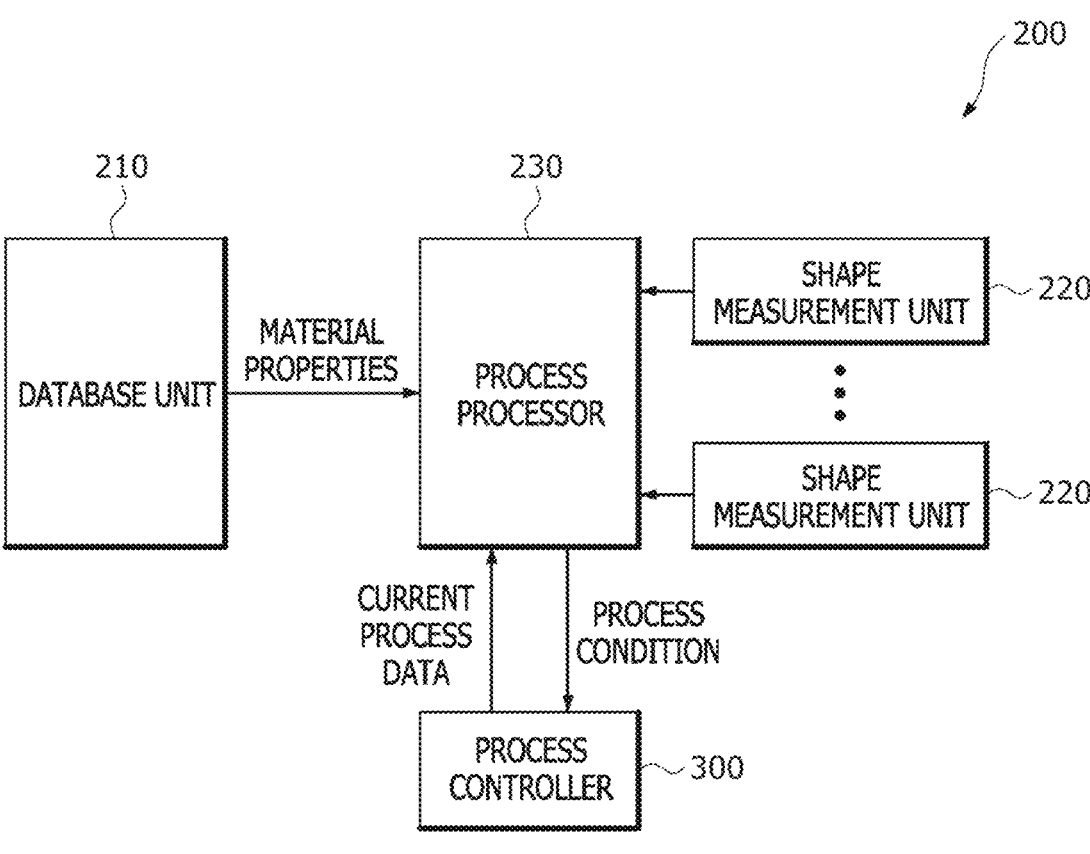
FIG. 8 is a block diagram illustrating an apparatus for forming hairpin coils according to still another embodiment of the present disclosure.
Figure 9:
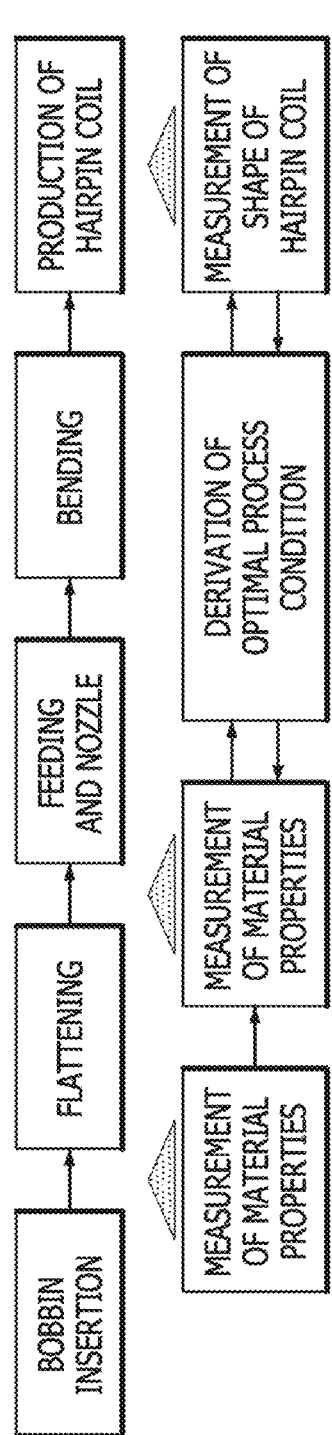
FIG. 9 is a conceptual diagram illustrating an operation of the apparatus for measuring physical properties of hairpin coils according to the embodiment of the present disclosure.

FIG. 8 is a block diagram illustrating an apparatus for forming hairpin coils according to still another embodiment of the present disclosure. FIG. 9 is a conceptual diagram illustrating an operation of the apparatus for measuring physical properties of hairpin coils according to the embodiment of the present disclosure.

Referring to FIGS. 8 and 9, the apparatus for forming hairpin coils, which is designated by reference numeral 200, according to the embodiment of the present disclosure receives the change in physical properties due to the plastic deformation before and after the flattening process calculated by the apparatus for measuring physical properties of hairpin coils 100.

The apparatus for forming hairpin coils 200 measures a shape of a current hairpin coil 30, and uses a change in physical properties due to plastic deformation before and after the flattening process depending on the measured shape of the hairpin coil 30 to derive a process condition of the hairpin coil 30.

The apparatus for forming hairpin coils 200 includes a database unit 210, a shape measurement unit 220, a process processor 230, and a process controller 300.

The database unit 210 stores the change in physical properties due to the plastic deformation before and after the flattening process calculated by the apparatus for measuring physical properties of hairpin coils 100.

The database unit 210 also stores process data in a forming process and shape data of the hairpin coil 30 measured by the shape measurement unit 220 to be described later.

The shape measurement unit 220 measures the shape of the hairpin coil 30.

Figure 10:
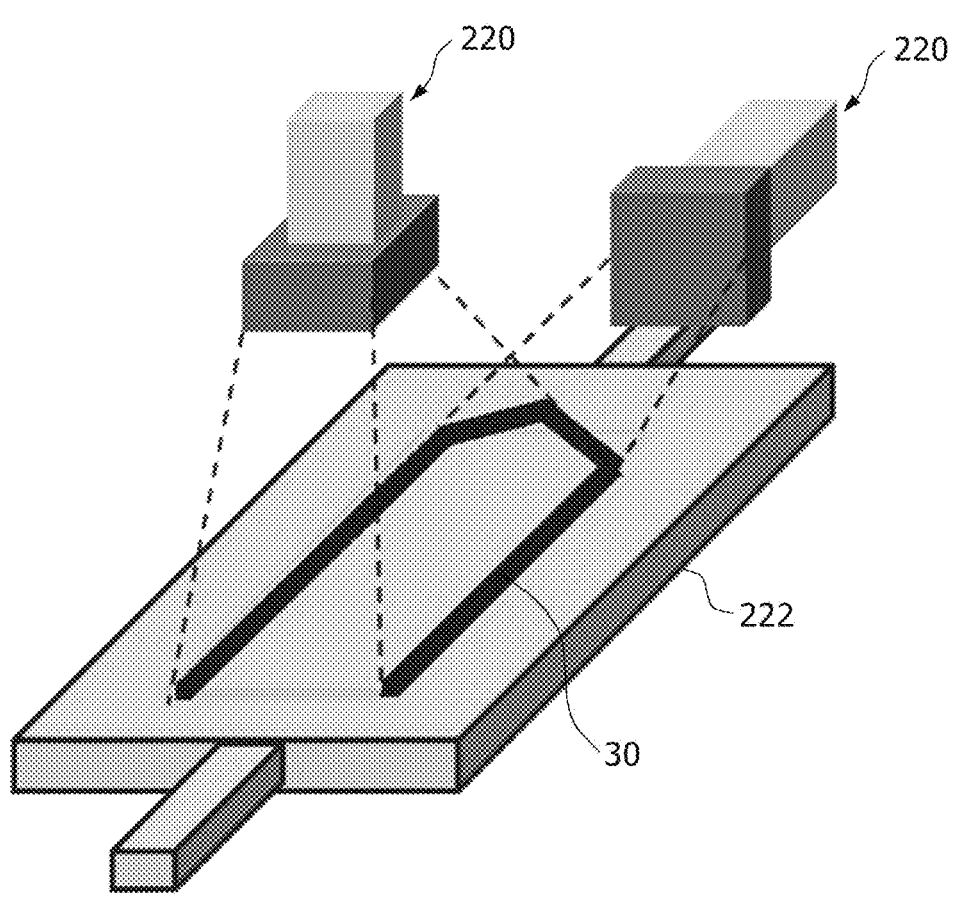
FIG. 10 is a view illustrating an example in which a shape of a hairpin coil is measured according to the embodiment of the present disclosure.
Figure 11:
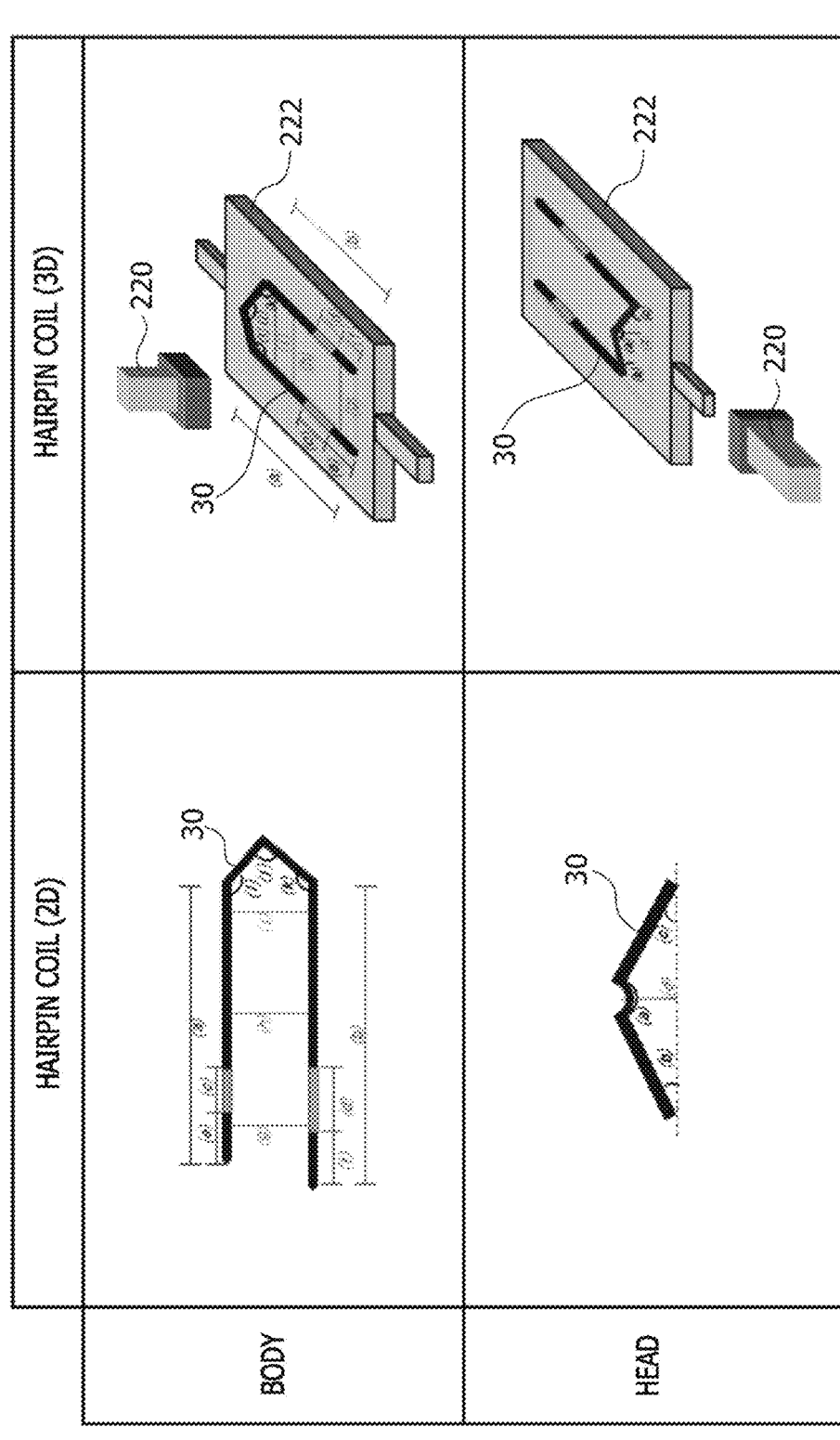
FIG. 11 is a view illustrating an example of shape dimensions of the hairpin coil according to the embodiment of the present disclosure.

FIG. 10 is a view illustrating an example in which the shape of the hairpin coil is measured according to the embodiment of the present disclosure. FIG. 11 is a view illustrating an example of shape dimensions of the hairpin coil according to the embodiment of the present disclosure.

Referring to FIGS. 10 and 11, the shape measurement unit 220 may be a 3D scanner, and may consist of a plurality of shape measurement units to measure the shape of the hairpin coil 30 in different directions.

The shape measurement unit 220 measures the length and angle of the body and the length and angle of the head of the hairpin coil 30.

The length and angle of the body illustrated in FIG. 11 are represented in Table 1 below.

TABLE 1

| | LENGTH | | ANGLE |
|---|---|---|---|
| a | LENGTH OF FIRST LEG | j | RIGHT ANG |
| b | LENGTH OF FINAL LEG | k | CENTER ANGLE |
| c | DECOATING LENGTH OF FIRST LEG | l | LEFT ANGLE |
| d | DECOATING LENGTH OF FINAL LEG | | |
| e | DECOATING POSITION OF FIRST LEG | | |
| f | DECOATING POSITION OF FINAL LEG | | |
| g | HEAD LENGTH | | |
| h | CENTER LENGTH | | |
| i | LEG LENGTH | | |

The length and angle of the head illustrated in FIG. 11 are represented in Table 2 below.

TABLE 2

| | LENGTH | | ANGLE |
|---|---|---|---|
| d | BENDING HEIGHT | a | BENDING ANGLE |
| | | b | LEFT HEIGHT ANGLE |
| | | c | RIGHT HEIGHT ANGLE |

That is, the shape measurement unit 220 measures the length and angle of the body and the length and angle of the head to input them to the process processor 230.

Reference numeral 222 is a vision plate disposed to improve accuracy when the shape of the hairpin coil is measured by the 3D scanner.

The process controller 300 controls a forming process line 10 to form the hairpin coil 30.

The process controller 300 transmits process data to the process processor 230.

The process controller 300 may receive a process condition from the process processor 230. The process controller 300 controls the forming process line 10 based on the process condition transmitted from the process processor 230 so as to ensure that the shape of the hairpin coil 30 matches a reference shape. The reference shape will be described later.

The process processor 230 compares the shape of the hairpin coil 30 measured by the shape measurement unit 220 with the reference shape, and derives the process condition of the hairpin coil 30 based on the process data and the physical properties of the material of the hairpin coil 30 according to a result of the comparison.

More specifically, the process processor 230 stores, in the database unit 210, the change in physical properties due to the plastic deformation before and after the flattening process extracted by the apparatus for measuring physical properties of hairpin coils 100.

The process processor 230 collects process data from the process controller 300 and stores the same in the database unit 210.

The process data may include process data between the flattening process and the feeding process of the material and between the nozzle process and the bending process of the material.

For example, the process data may include motion data of a bending robot and a feeding length of the hairpin coil 30.

Figure 12:
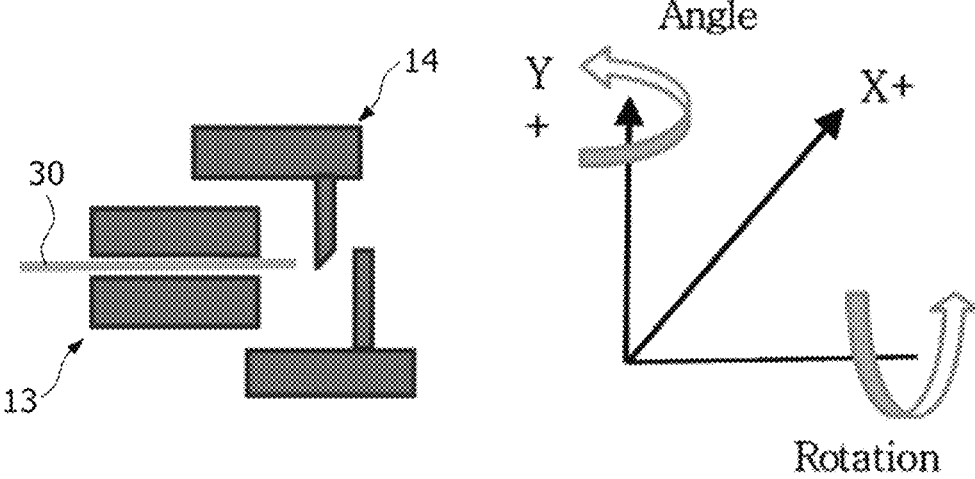
FIG. 12 is an exemplary view illustrating movement of a CNC bending robot according to the embodiment of the present disclosure.
Figure 13:
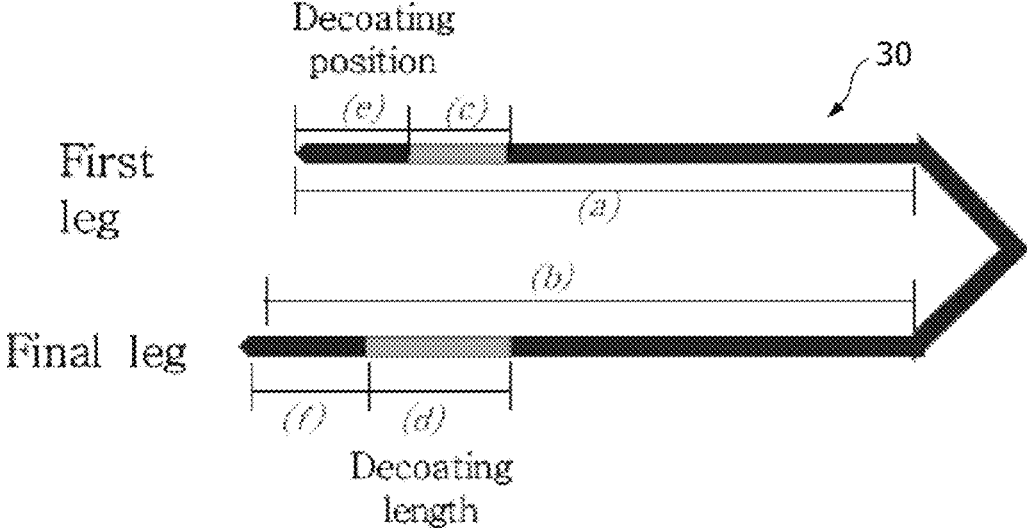
FIG. 13 is an exemplary view illustrating a feeding length of the hairpin coil according to the embodiment of the present disclosure.

FIG. 12 is an exemplary view illustrating movement of a CNC bending robot according to the embodiment of the present disclosure. FIG. 13 is an exemplary view illustrating a feeding length of the hairpin coil 30 according to the embodiment of the present disclosure.

The process data may be motion data of the bending robot as illustrated in FIG. 12. The bending robot may include, for example, both a CNC bending robot and a press bending robot.

The process data may be the feeding length of the hairpin coil as illustrated in FIG. 13.

The process processor 230 causes the shape measurement unit 220 to measure the shape of the hairpin coil 30 to store the same in the database unit 210.

The process processor 230 compares the shape of the hairpin coil 30 measured by the shape measurement unit 220 with the reference shape to determine whether they match each other.

The reference shape is the normal shape of the hairpin coil 30, which is used to determine whether the shape of the hairpin coil 30 measured by the shape measurement unit 220 is normal.

If the shape of the hairpin coil 30 matches the reference shape, the process processor 230 determines that the shape of the hairpin coil 30 is normal.

If the shape of the hairpin coil 30 does not match the reference shape, it is determined that the shape of the hairpin coil 30 is defective. In this case, the process processor 230 derives a process condition based on the process data and the changes in physical properties due to the plastic deformation before and after the flattening process.

The process condition may include, but is not limited to, a feeding length, a bending angle, and a bending speed of the material.

The process processor 230 transmits the derived process condition to the process controller 300.

The process controller 300 controls the forming process line 10 based on the process condition transmitted from the process processor 230 so as to ensure that the shape of the hairpin coil 30 matches the reference shape.

Hereinafter, a method of forming hairpin coils according to an exemplary embodiment of the present disclosure will be described in detail with reference to FIG. 14.

Figure 14:
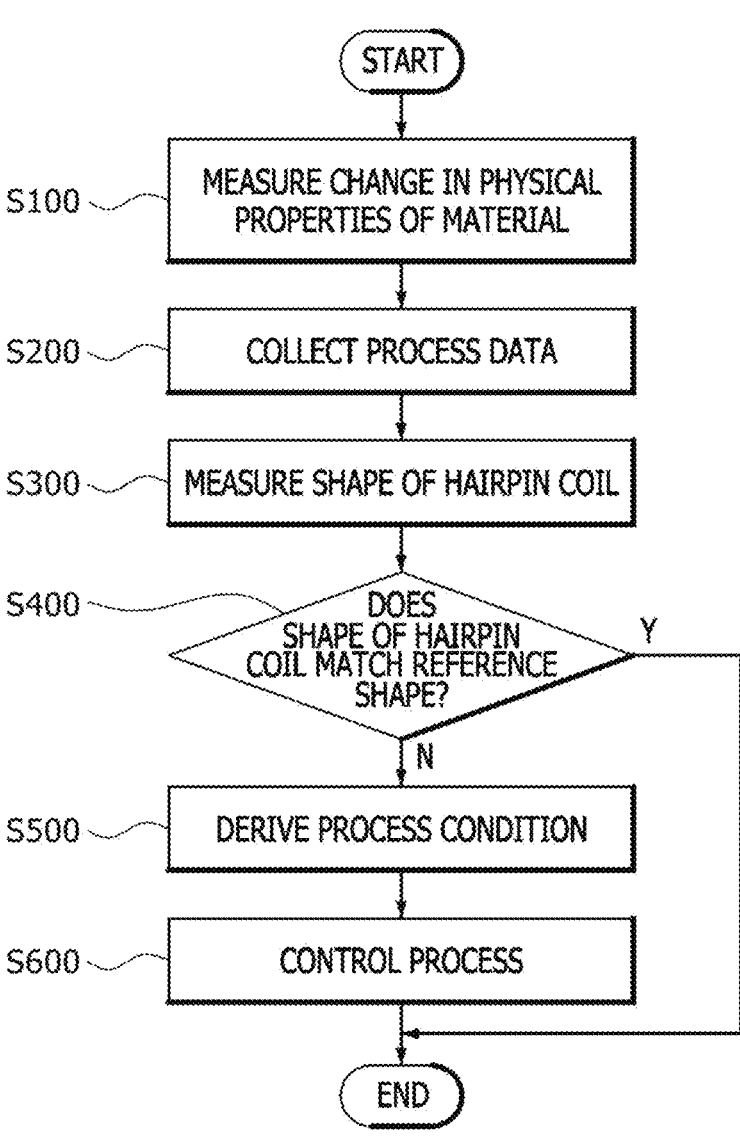
FIG. 14 is a flowchart illustrating a method of forming hairpin coils according to a further embodiment of the present disclosure.

FIG. 14 is a flowchart illustrating a method of forming hairpin coils according to a further embodiment of the present disclosure.

Referring to FIG. 14, an apparatus for measuring physical properties of hairpin coils 100 first measures a change in physical properties due to plastic deformation before and after a flattening process (S100), and transmits the measured change in physical properties to a process processor 230.

The process processor 230 stores, in a database unit 210, the change in physical properties transmitted from the apparatus for measuring physical properties of hairpin coils 100.

The process processor 230 collects process data from a process controller 300 (S200), and stores the same in the database unit 210.

The process processor 230 causes a shape measurement unit 220 to measure a shape of a hairpin coil 30 (S300), and stores the measured shape of the hairpin coil 30 in the database unit 210.

The process processor 230 compares the shape of the hairpin coil 30 with a reference shape to determine whether the shape of the hairpin coil 30 matches the reference shape (S400).

If the shape of the hairpin coil 30 matches the reference shape as a result of the determination in step S400, the process processor 230 determines that the shape of the hairpin coil 30 is normal.

On the other hand, if the shape of the hairpin coil 30 does not match the reference shape, the process processor 230 derives a process condition based on the process data and the change in physical properties due to the plastic deformation before and after the flattening process (S500).

Next, the process processor 230 transmits the derived process condition to the process controller 300.

The process controller 300 controls a forming process line 10 based on the process condition transmitted from the process processor 230 so as to ensure that the shape of the hairpin coil 30 matches a reference shape (S600).

As described above, in the apparatus and method for measuring physical properties of hairpin coils, and the method of forming hairpin coils based on the same according to the present disclosure, it is possible to manufacture the hairpin coil 30 by measuring the physical properties of the material in a non-destructive manner in real time and deriving the process condition based on the measured physical properties of the material.

In addition, in the apparatus and method for measuring physical properties of hairpin coils, and the method of forming hairpin coils based on the same according to the present disclosure, it is possible to acquire and store the highly reliable physical properties of the material and optimize the forming process of the hairpin coil 30 based on the measured physical properties of the material.

The implementations described herein may be implemented in, for example, a method or a process, an apparatus, a software program, a data stream, or a signal. Even if only discussed in the context of a single form of implementation (for example, discussed only as a method), the implementation of features discussed may also be implemented in other forms (e.g., an apparatus or program). The apparatus may be implemented in, for example, appropriate hardware, software, and firmware. The method may be implemented in, for example, an apparatus such as a processor, which refers to a processing device in general, including, for example, a computer, a microprocessor, an integrated circuit, or a programmable logic device. The processor also includes communication devices such as computers, cell phones, portable/personal digital assistants ("PDAs"), and other devices that facilitate communication of information between end-users.

While the present disclosure has been described with respect to the embodiments illustrated in the drawings, it will be obvious to those skilled in the art that such embodiments are provided by way of example only. It will be understood by those skilled in the art that various modifications and other equivalent embodiments may be made without departing from the spirit and scope of the disclosure as defined in the following claims. Therefore, the technical protection scope of the present disclosure should be defined by the following claims.

What is claimed is:

1. An apparatus for measuring physical properties of hairpin coils, comprising:

a first current sensor configured to perform a first measurement prior to a flattening process on a material of a hairpin coil, by applying a first current for a frequency to the material to measure a first induced current applied to the material;

a measurement processor configured to measure physical properties of the material by measuring an impedance of the material with the first induced current measured by the first current sensor and applying the impedance to an established distribution and a trend of the established distribution to extract an induced current parameter that reflects the physical properties of the material;

a flattening process module configured to perform a flattening process after the first measurement by wounding the material around a bobbin by pressing the material with a plurality of rollers;

a second current sensor configured to perform a second measurement after the flattening process, by applying a second current for the frequency to the material to measure a second induced current applied to the material, wherein the measurement processor is further configured to, based on the induced first and second currents respectively measured by the first and second current sensors, extract a change in the physical properties before and after the flattening process due to a plastic deformation occurred during the flattening process, and transmit the change in the physical properties to a process processor for forming the hairpin coils.

2. The apparatus according to claim 1, wherein the first current sensor is configured to be in contact with the material to measure the first induced current generated in the material in a non-destructive manner.

3. A method for measuring physical properties of hairpin coils, comprising:

applying, by a first current sensor, a first current for a frequency to a material of a hairpin coil to measure a first induced current applied to the material;

measuring, by a measurement processor, physical properties of the material by measuring an impedance of the material with the first induced current measured by the current sensor and applying the impedance to an established distribution and a trend of the established distribution to extract an induced current parameter that reflects the physical properties of the material;

after the measurement, flattening the material by wounding the material around a bobbin by pressing the material with a plurality of rollers;

after the flattening, applying, by a second current sensor, a second current for the frequency to the material to measure a second induced current applied to the material;

based on the induced first and second currents respectively measured by the first and second current sensors, extracting, by the measurement processor, a change in the physical properties before and after the flattening due to a plastic deformation occurred during the flattening; and transmit, by the measurement processor, the change in the
        physical properties to a process processor for forming
        the hairpin coils.

4. The method according to claim 3, wherein the induced current parameter comprises at least one of an amplitude, a phase, a real component, and an imaginary component of the induced current.

5. The method according to claim 3, wherein the physical properties of the material comprise at least one of yield strength, tensile strength, and elongation of the material.

* * * * *